US010550492B2

(12) United States Patent
Misra et al.

(10) Patent No.: US 10,550,492 B2
(45) Date of Patent: Feb. 4, 2020

(54) ELECTRONIC DEVICE GRADE SINGLE CRYSTAL DIAMONDS AND METHOD OF PRODUCING THE SAME

(71) Applicant: IIA Technologies Pte. Ltd., Singapore (SG)

(72) Inventors: Devi Shanker Misra, Singapore (SG); Alvarado Tarun, Singapore (SG)

( * ) Notice: Subject to any disclaimer, the term of this patent is extended or adjusted under 35 U.S.C. 154(b) by 41 days.

(21) Appl. No.: 14/943,820

(22) Filed: Nov. 17, 2015

(65) Prior Publication Data

US 2016/0201221 A1     Jul. 14, 2016

(30) Foreign Application Priority Data

Jan. 14, 2015 (SG) ............... 10201500278Y
Jul. 10, 2015 (SG) ............... 10201505413V

(51) Int. Cl.
| | | |
|---|---|---|
| C30B 25/18 | (2006.01) | |
| C30B 25/20 | (2006.01) | |
| C30B 29/04 | (2006.01) | |
| H05H 1/30 | (2006.01) | |

(52) U.S. Cl.
CPC ............ C30B 25/186 (2013.01); C30B 25/20 (2013.01); C30B 29/04 (2013.01)

(58) Field of Classification Search
USPC ............ 427/535, 539, 575; 428/338; 117/90
See application file for complete search history.

(56) References Cited

U.S. PATENT DOCUMENTS

| | | | |
|---|---|---|---|
| 5,015,494 A | 5/1991 | Yamazaki | |
| 5,094,915 A | 3/1992 | Subramaniam | |
| 5,443,032 A | 8/1995 | Vichr et al. | |
| 5,479,875 A * | 1/1996 | Tachibana | ............... C23C 16/02 117/103 |
| 8,992,877 B2 | 3/2015 | Misra | |
| 2005/0266606 A1 | 12/2005 | Chevallier et al. | |
| 2007/0196263 A1 | 8/2007 | Hemley et al. | |
| 2008/0156256 A1 | 7/2008 | Linares et al. | |
| 2009/0175777 A1 * | 7/2009 | Scarsbrook | ........... C30B 25/105 423/446 |
| 2009/0297429 A1 * | 12/2009 | Vohra | ................... C30B 25/105 423/446 |
| 2010/0015438 A1 | 1/2010 | Williams et al. | |
| 2010/0034984 A1 | 2/2010 | Asmussen et al. | |
| 2012/0103250 A1 * | 5/2012 | Kato | ....................... C30B 25/02 117/101 |
| 2013/0239615 A1 | 9/2013 | Misra | |

FOREIGN PATENT DOCUMENTS

| | | | |
|---|---|---|---|
| JP | 2006315942 | * | 11/2006 |
| WO | WO2009/154577 A1 | | 12/2009 |

OTHER PUBLICATIONS

PCT Search Report and Written Opinion in PCT application PCT/SG2010/000384, dated Dec. 14, 2010.
Feb. 26, 2014 Office Action in U.S. Appl. No. 12/933,059.
Nov. 22, 2017 Office Action in U.S. Appl. No. 13/825,930.
Physics and Applications of CVD Diamond, Satoshi Koizumi, Christoph Nebel, Milos Nesladek, ISBN: 978-3-527-40801-6—pp. 29 and 32 to 71.

* cited by examiner

Primary Examiner — Tae H Yoon
(74) Attorney, Agent, or Firm — Brooks Kushman

(57) ABSTRACT

A method utilising microwave plasma chemical vapour deposition (MPCVD) process of producing electronic device grade single crystal diamond comprising of: (a) selecting a diamond seed or substrate having a pre-determined orientation, (b) cleaning and/or etching of non-diamond phases and other induced surface damages from the diamond seed or substrate, whereby this step can be performed one or more times, (c) growing a layer of extremely low crystal defect density diamond surface on the cleaned/etched diamond seed or substrate, whereby this step can be performed one or more times, and (d) growing electronics device grade single crystal diamond on top of the layer of the low crystal defect density diamond surface.

6 Claims, 12 Drawing Sheets
(2 of 12 Drawing Sheet(s) Filed in Color)

ELECTRONIC DEVICE GRADE SINGLE CRYSTAL DIAMONDS AND METHOD OF PRODUCING THE SAME

This application claims the benefit of, and priority to, Singapore Provisional Application No. 10201500278Y, filed Jan. 14, 2015, and Singapore Patent Application No. 10201505413V, filed Jul. 10, 2015, the contents of which are incorporated by reference herein in their entireties.

FIELD OF THE INVENTION

The invention relates to electronic device grade single crystal diamonds and a method of producing electronic device grade diamonds grown by microwave plasma chemical vapour deposition (MPCVD) process.

BACKGROUND

The demand for electronics device grade single crystal diamonds has been increasing steadily through the years due to its wide-range of scientific and industrial applications, beside gems. The remarkable intrinsic properties of electronic grade single crystal diamonds is one of the reasons why it is a preferred material for industrial and scientific applications, as well as gems.

Diamond deposition by CVD process on various solid substrates have been extensively described in various patent documents and also extensively investigated by researchers and published in scientific journals and other technical literatures. The process of diamond growth by CVD process involves the deposition of carbon atoms that originate from the dissociation of a carbon-containing gas precursor (i.e. $C_xH_y$ (x=1 to 4)) on a solid substrate under the reaction of a mixture of several gases ($H_2$, Ar, $O_2$, $Nb_2$, $CO_x$, $CF_x$ etc.). Polycrystalline or single crystal CVD diamonds can be produced and their crystalline quality strongly depends not only on the process chemistry of the gases used, but also on the nature and condition of the solid substrate as well. It is a well-established method to nucleate diamond internally in the conventional growth of microcrystalline diamond films to use a hydrocarbon-rich mixture of hydrocarbon-hydrogen precursor gases.

Several patent documents and scientific literatures disclose various methods of producing large poly-crystalline diamond films for radiation wave detection. The disadvantages of these large poly-crystalline diamond films is that the firms are not only limited in thickness but also limited in charge collection distance due to the presence of grain boundaries that drastically affect their electronic properties.

European patent publication No. EP19830380A2 discloses the method of producing diamonds suitable for electronic applications by CVD process. However, the electronics properties of these diamonds are believed to be affected by the presence of minute impurities (>1 ppm) and lattice defects which will reduces their charge collection efficiency/distance. Production of full collection distance at lower bias field (<0.2V/μm) detectors based on single crystal diamond with extremely high reproducibility through sufficient control of the growth process and tight selection of solid substrate by CVD process has not been disclosed.

U.S. Pat. No. 7,887,628 discloses a layer of single crystal CVD diamond having a thickness of greater than 2 mm, wherein the layer has a level of any single impurity of not greater than 1 ppm and a total impurity content of not greater than 5 ppm whereby the impurity excludes hydrogen in isotopic forms and in electron paramagnetic resonance (EPR), a single substitutional nitrogen centre [N—C]$^0$ at a concentration <100 ppb.

US Patent Application Publication 2013/0202518 discloses a single crystal CVD diamond having a level of any single impurity of not greater than 5 ppm and a total impurity content of not greater than 10 ppm wherein impurity excludes hydrogen in isotopic forms, and in electron paramagnetic resonance (EPR), a single substitutional nitrogen centre [N—C]$^0$<40 ppb.

It is an object of the present invention to provide a method of utilising microwave plasma chemical vapour deposition (MPCVD) process to produce electronic device grade single crystal diamonds having a size up to 10×10×2 mm$^3$ and also with a charge collection efficiency (CCE) of 100% when the bias field is at least 0.2 V/μm.

The reason of growing thick electronic device grade single crystal diamond is to prevent the formation of crystal defects such as thread dislocations, crystal plane twining, "petal-shape" defects and step-growth related dislocations. Generally, these crystal defects grow and propagate during growth and eventually results in highly stressed MPCVD diamonds. These stresses are known to degrade the charge carrier mobilities and lifetimes of diamond based detectors. The method described herein includes the step of pre-growth conditioning on the diamond substrate so as to suppress the crystal defects from growing and preparing the substrates that are substantially free of crystal defects and impurities.

Other objects and advantages of the present invention will become apparent from the following description, taken in connection with the accompanying drawings, wherein, by way of illustration and example, an embodiment of the present invention is disclosed.

SUMMARY OF INVENTION

In accordance to a first aspect of the present invention, there is provided a method utilising microwave plasma chemical vapour deposition (MPCVD) process of producing electronic device grade single crystal diamond comprising of: (a) selecting a diamond seed or substrate having a pre-determined orientation, (b) cleaning and/or etching of non-diamond phases and other induced surface damages from the diamond seed or substrate, whereby this step can be performed one or more times, (c) growing a layer of extremely low crystal defect density diamond surface on the cleaned/etched diamond seed or substrate, whereby this step can be performed one or more times, and (d) growing electronics device grade single crystal diamond on top of the layer of the low crystal defect density diamond surface.

In accordance to a second aspect of the present invention, there is provided an electronic device grade single crystal diamond comprising: a charge of collection efficiency (CCE) of 100% when the bias field is at least 0.2V/μm, a low level of nitrogen defined by an absence of a signal for single substitutional nitrogen centres [N—C]$^0$, indicating a concentration of said single substitutional nitrogen centres of <100 ppb using FTIR and <100 ppb using UV-VIS absorption spectroscopy at 270 nm, and typically <30 ppb using electron paramagnetic resonance (EPR), an absence of C—H stretch absorption and hydrogen related vibrations in the infrared (IR) spectral range of 2500 cm$^{-1}$ to 3400 cm$^{-1}$ when infrared transmittance is greater than 70% in a FTIR spectrum, and a concentration of silicon related vacancies of <50 ppb defined by an absence of traces of silicon related vacancy peaks (SiV) at 738 nm, nitrogen related vacancy peaks (NV−) at 637 nm using photoluminescence spectroscopy.

BRIEF DESCRIPTION OF DRAWINGS

The patent or application file contains at least one drawing executed in color. Copies of this patent or patent application publication with color drawing(s) will be provided by the Office upon request and payment of the necessary fee.

This then generally describes the invention but to assist with understanding reference will now be made to the accompanying drawings which show preferred embodiments of the invention.

DETAILED DESCRIPTION

Figure 1:
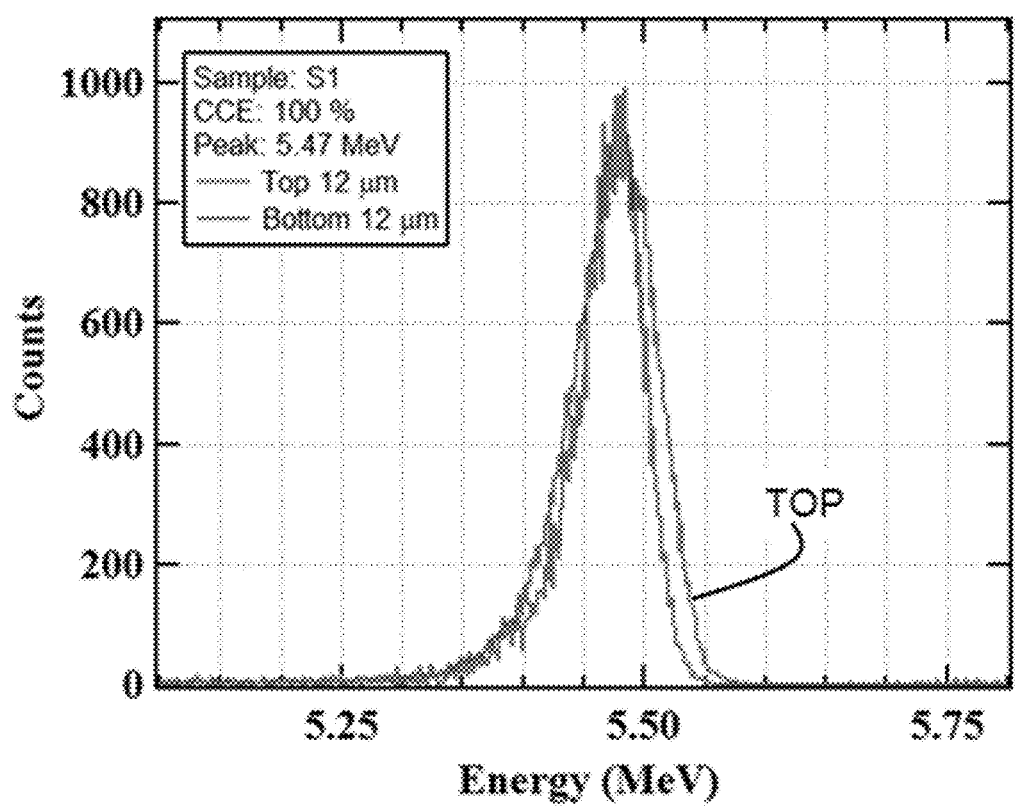
FIG. 1 shows a plot of the charge collection efficiency (CCE) (CCE=100%) measured at the top (red) and bottom (blue) layer of the CVD diamond biased at 0.8V/μm bias field according to a preferred embodiment of the invention. Energy spectrum was obtained when electronic device grade single crystal diamond detector is exposed to a radiation source in the form of Americium ($^{241}$Am) alpha source.

The Figures are diagrammatic and not drawn to scale. In the Figures, elements which correspond to elements already described have the same reference numerals.

According to an aspect of the present invention, there is provided a method utilising microwave plasma chemical vapour deposition (MPCVD) process to produce electronic device grade single crystal diamonds.

The first step comprises of selecting a diamond seed or substrate having a pre-determined orientation. In a preferred embodiment of the present invention, the orientation of the diamond seeds or substrate is {001}. In a preferred embodiment of the present invention, the selection of the substrate having a pre-determined orientation is performed by looking at the high magnification optical images of 100× to check for surface defects, polishing induced defects, etch pits and inclusions. In another embodiment of the present invention, the high magnification optical images of 40× may be used. In a preferred embodiment of the present invention, a cross-polarized imaging may be performed on the High Pressure, High Temperature (HPTH) grown, natural, or MPCVD grown diamond to check for the presence of any lattice imperfection as a result due to strain. Crystal-axis check of the substrate is also performed to ensure that off-axis angle relative to the {100} orientation axis does not exceed 3 degrees. If necessary, etching the top surface of the substrate to reveal and/or remove the surface damage is performed to reduce the overall defect density.

The second step comprises of cleaning and/or etching of non-diamond phases and other induced surface damages from the diamond seed or substrate. Non-diamond phases are removed from the substrate by cleaning it in a boiling acid bath having temperature greater than 300° C. and subsequently underwent different plasma etching for 30 to 180 minutes. Plasma etching of acid cleaned substrates by microwave plasma chemical vapour deposition (MPCVD) involves etching temperature from about 700° C. to about 1200° C. in a MPCVD chamber having an atmosphere with a pressure of about 100 to 300 torr, wherein the atmosphere therein comprises of about 0.1% to about 10% oxygen per unit of hydrogen. The plasma etching method for substrate preparations take place in a MPCVD chamber considerably free of nitrogen. The MPCVD chamber also comprises of gas precursors which are well purified such that the total impurities is less than 500 ppb in a preferred embodiment of the present invention. In other embodiments, the impurities may be less than 1 ppm.

The third step comprises of growing a layer of extremely low crystal defect density diamond surface on the cleaned/ etched diamond seed or substrate. The pre-growth process for production of electronic device grade single crystal diamond by microwave plasma chemical vapour deposition (MPCVD) on the growth surface of the diamond seeds takes place at a temperature from about 700° C. to about 1200° C. in a MPCVD chamber, wherein the atmosphere therein comprises of a mixture of about 1% to about 15% $CH_4$ per unit of $H_2$ only or with some additional mixture of about 1% to about 50% $O_2$ per unit of $CH_4$.

The fourth step comprises of growing electronic device grade single crystal diamond on top of the layer of low crystal defect density diamond surface. The method of growing electronic device grade single crystal diamond includes controlling temperature of a growth surface of about 700° C. to about 1200° C. in a MPCVD chamber, wherein the pressure therein comprises of about 100 to about 300 torr and the atmosphere therein comprises of a mixture of about 0.1% to about 15% $CH_4$ per unit of $H_2$.

It is submitted that the growth rate of electronic device grade single crystal diamond is about 1 µm/hour to 15 µm/hour.

In other embodiments of the present invention, the second and third steps may be repeated more than one time so as to achieve a desired and optimum result.

During the whole process of pre-growth and growth of electronic device grade single-crystal diamond, the incorporation of impurities is well controlled by making sure that the MPCVD chamber where the diamond growth takes place is considerably free of nitrogen. In addition, gas precursors are also well purified such that the total impurities is less than 500 ppb in a preferred embodiment of the present invention. In other embodiments, the impurities may be less than 1 ppm.

It is submitted that the method produces an electronic device grade single-crystal diamond with the characteristics as described hereinafter.

Figure 2:
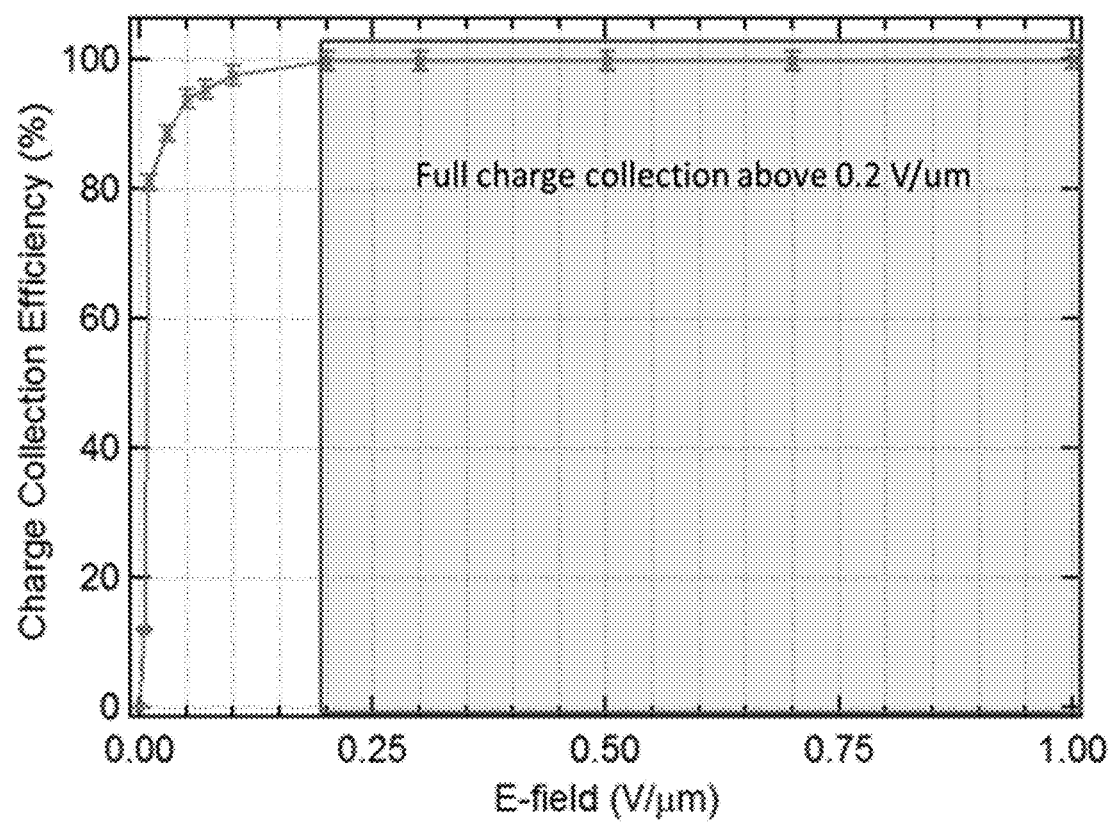
FIG. 2 shows a plot of the CCE as a function of electric field (bias voltage/sample thickness) according to a preferred embodiment of the invention. Full charge collection efficiency of 100% is obtained at bias field of at least 0.2V/μm.

In accordance with an aspect of the present invention, the electronic device grade single-crystal diamond comprises of a charge collection efficiency (CCE) of 100% when the bias field of at least 0.2V/µm as shown in FIG. 2. Charge collection efficiency (CCE) is the ratio of the total charge detected to the total charge generated by radiation source in the form of Alpha Americium source. The measured charge collection distance of electronic device grade single crystal diamond produced by MPCVD process is limited by the sample thickness. Collection distance of 1000 µm can be obtained at 200V electrical bias when using a radiation source in the form of beta radiation source (Strontium $^{90}$Sr).

In accordance with an aspect of the present invention, the electronic device grade single crystal diamond exhibits a low level of nitrogen. The low level of nitrogen is determined in photoluminescence spectrum in FIG. 6 and in the typical FTIR spectrum in FIG. 9. In a preferred embodiment of the present invention, there is an absence of a signal for single substitutional nitrogen centres [N—C]$^0$ which indicates a concentration of said single substitutional nitrogen centres of <100 ppb using FTIR and <100 ppb using UV-VIS absorption spectroscopy at 270 nm, and typically <30 ppb using electron paramagnetic resonance (EPR).

Figure 9:
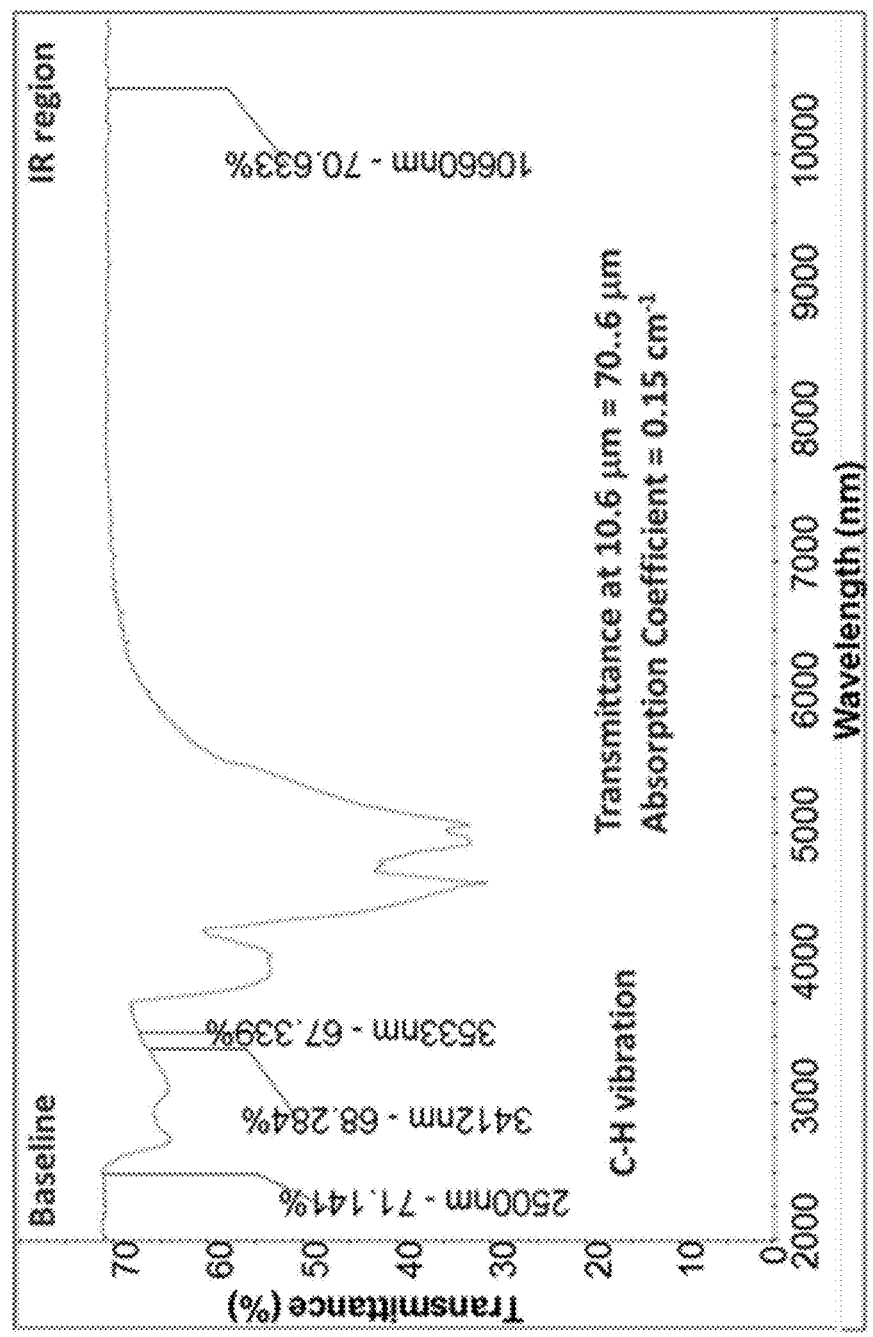
FIG. 9 shows a plot of the typical FTIR spectrum of the electronic-device grade single crystal diamond according to a preferred embodiment of the invention.

As shown in a typical FTIR spectrum in FIG. 9, when infrared transmittance is greater than 70% which approaches theoretical demand for diamond, there is an absence of C—H stretch absorption and hydrogen related vibrations in the infrared (IR) spectral range of 2500 cm$^{-1}$ to 3400 cm$^{-1}$. In a preferred embodiment of the present invention, the substitutional nitrogen has values of [NVH]$^0$=3123 cm$^{-1}$, Ns$^+$=1332 cm$^{-1}$ and Ns$^0$=1344 cm$^{-1}$ and the hydrogen related vibrations has a value of 2500 cm$^{-1}$ to 3400 cm$^{-1}$.

In other embodiments, the level of nitrogen may be quantified by other suitable experimental techniques.

Figure 10:
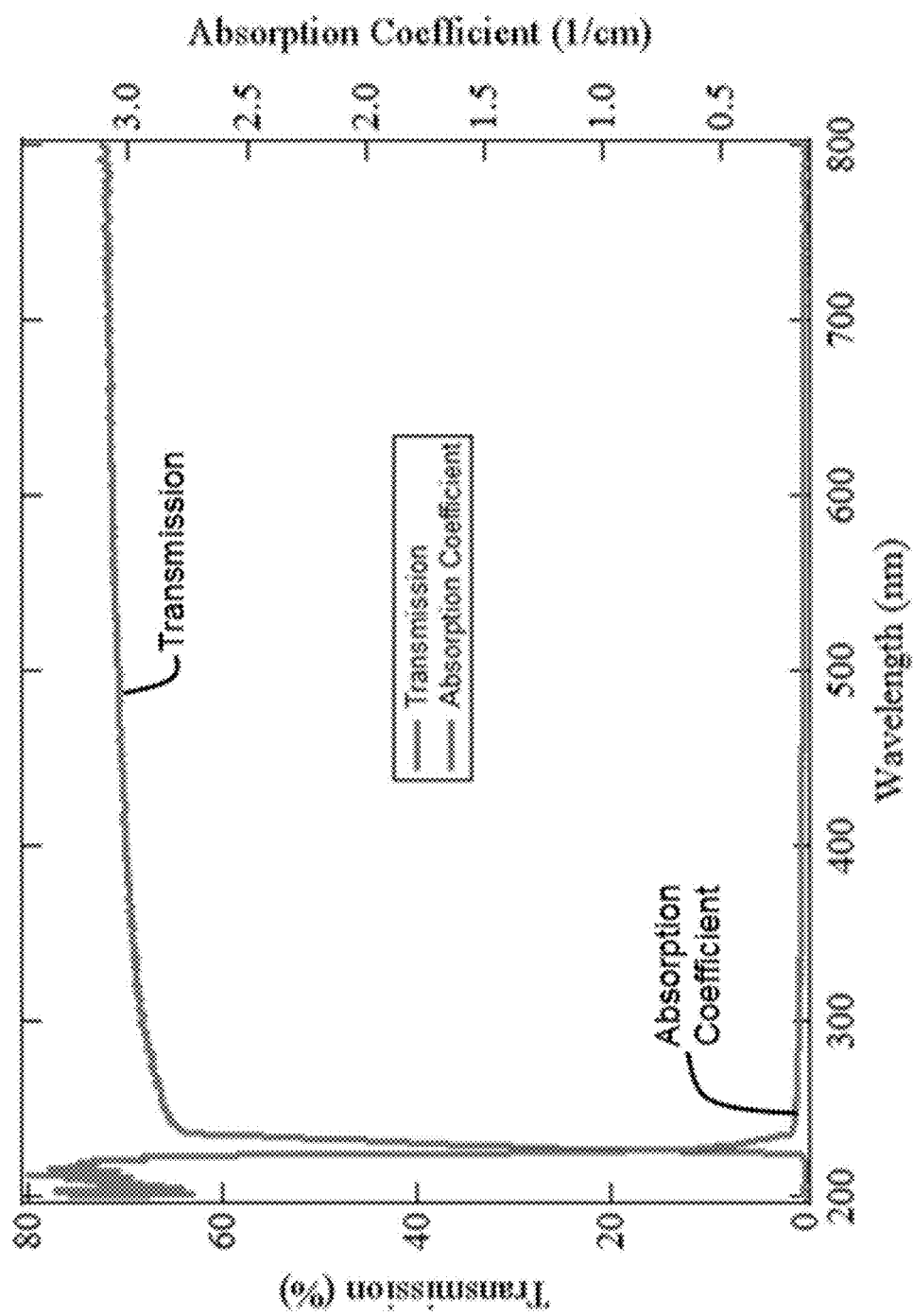
FIG. 10 shows a plot of the UV-VIS spectrum measured from the electronic-device grade single crystal diamond according to a preferred embodiment of the invention. As shown, there is no traces of detectable nitrogen related peaks at 270 nm in the UV region and silicon related peaks at 738 nm.

In accordance with an aspect of the present invention, the electronic device grade single crystal diamond also exhibits concentration of silicon related vacancies of <50 ppb. The concentration of silicon related vacancies of <50 ppb using photoluminescence spectroscopy as shown in a plot of the UV-VIS spectrum measured from the diamond is shown in FIG. 10. In a preferred embodiment of the present invention, there is an absence of traces of silicon related vacancy peaks (SiV) at 738 nm, nitrogen related vacancy peaks (NV−) at 637 nm.

In a preferred embodiment of the present invention, the resistance of the electronic device grade single crystal diamond produced by MPCVD process at room temperature is greater than $1\times10^{15}\Omega$ as obtained from I-V measurement. The C—V measurements show that the capacitance of less than 2 pF can be easily obtained. The capacitance approaches close to the theoretical limit.

Figure 3:
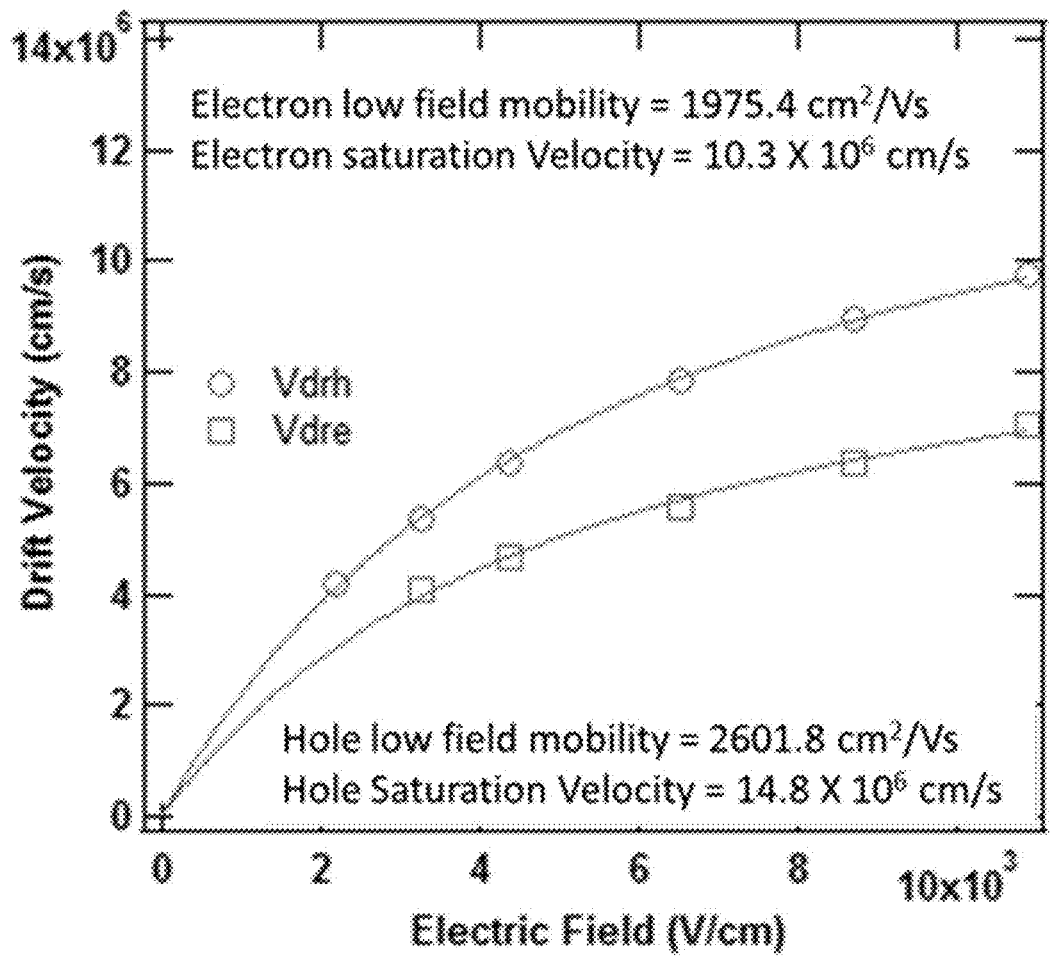
FIG. 3 shows a plot of the drift velocity against electric field at room temperature (295K) according to a preferred embodiment of the invention. The fit result shows low-field mobility and saturation velocity for both holes and electrons.
Figure 4:
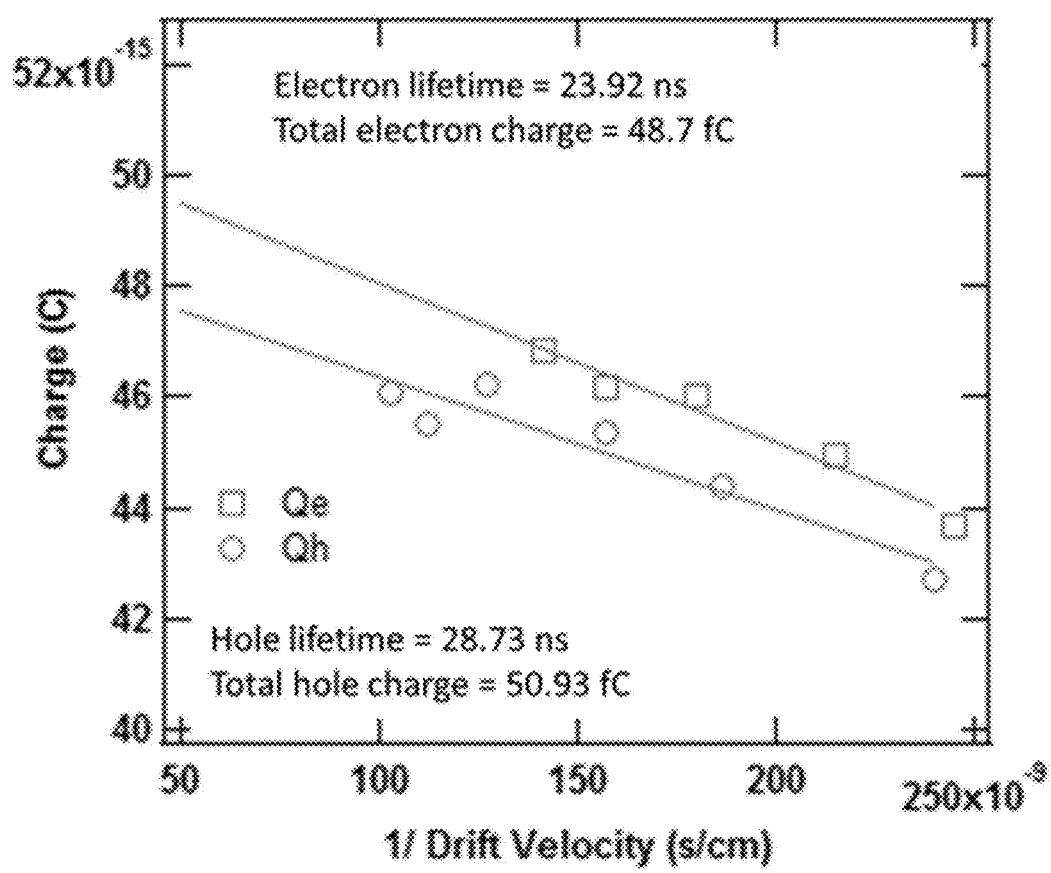
FIG. 4 shows a plot showing collected charge (C) against the inverse of drift velocity at room temperature (295K) according to a preferred embodiment of the invention. The fit result shows the carrier lifetimes for both holes and electrons.

In accordance with an aspect of the present invention, the electronic device grade single crystal diamond has low field electron mobility $\mu_{0,e}$ greater than 1800 cm$^2$/Vs and low field hole mobility $\mu_{0,h}$ greater than 2600 cm$^2$/Vs for both electrons and holes at room temperature respectively. The saturation velocity ($v_{sat}$) for electrons and holes are $v_{sat,e}$>1.0×10$^7$ cm/s and $v_{sat,h}$>1.4×10$^7$ cm/s respectively. The carrier mobility and drift velocity of the diamond are obtained by transient current technique (TCT) as shown in FIG. 3. The carrier lifetime (τ) for electrons, $\tau_e$>20.0 ns whereas the carrier lifetime for holes, $\tau_h$>25.0 ns can be obtained as shown in the plot in FIG. 4.

Figure 5:
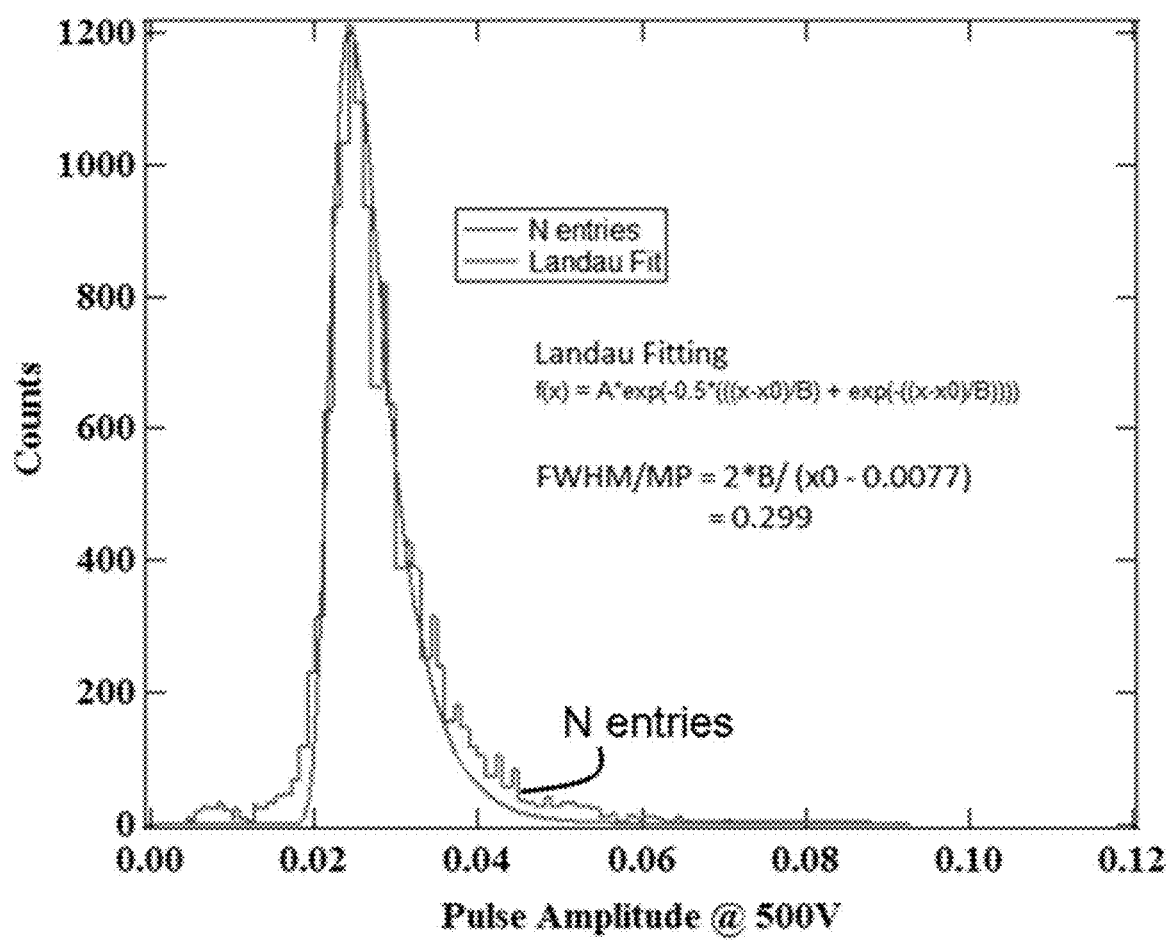
FIG. 5 shows charge signal distribution measured from electronic device grade single diamond detector when it is exposed to a radiation source in the form of Strontium ($^{90}$Sr) radiation source according to a preferred embodiment of the invention. The landau fit result shows that FWHM/MP is approximately 0.3.

In a preferred embodiment of the present invention, the charge signal distribution of the electronic device grade single crystal diamond has the shape of a Landau distribution curve where the most probable peak of the charge signal distribution depends on the density of defects and impurities in the electronic device grade single crystal diamond. The ratio of full-width-at-half-maximum (FWHM) to the most probable peak (MP) from charge (positive Landau) signal distribution (FHWM/MP) is smaller than 0.3. The charge signal distribution measured from the electronic device grade single crystal diamond detector is obtained when it is exposed to a radiation source in the form of Strontium ($^{90}$Sr) radiation source is shown in FIG. 5.

Figure 11:
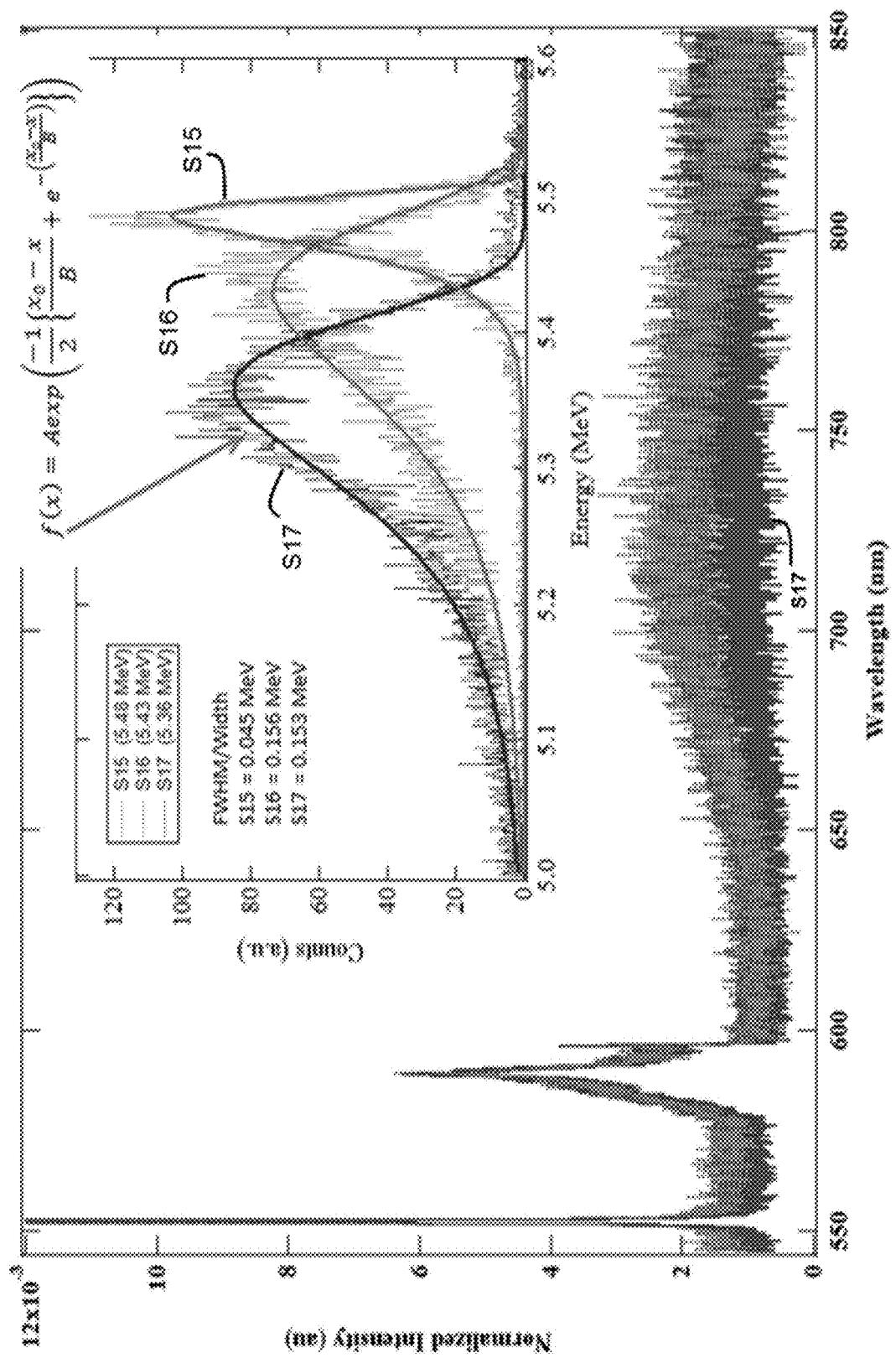
FIG. 11 shows the photoluminescence spectra of diamonds having similar level of intensities for energy resolution dependence study according to a preferred embodiment of the invention. The insert shows energy spectrum when electronic device grade single crystal diamond detector is exposed to a radiation source in the form of Americium ($^{241}$Am) radiation source taken at 0.8V/μm bias field. The spectrum is fitted using the landau equation.

FIG. 11 shows the fluorescence spectra of three (3) samples of diamond based detectors having nearly the same level of fluorescence intensity (impurities) in a preferred embodiment of the present invention. The inset shows the $^{241}$Am energy spectra obtained from these 3 samples at 0.8V/µm bias field. The data was fitted with negative landau distribution with amplitude A, $$f(x) = A\exp\left(\frac{-1}{2}\left\{\frac{-x+x_0}{B} + e^{-\left(\frac{-x+x_0}{B}\right)}\right\}\right),$$

in order to obtain the most probably peak ($x_0$) for CCE calculation. The width of the energy spectrum provides the energy resolution response of the diamond based detector which can be obtained from parameter B. The fitting results are depicted at the inset labelled as FWHM/Width. As shown, although the level of fluorescence intensities (impurities) of the 3 samples are the same, but the level of CCE of the three diamond based detectors are different.

Figure 12:
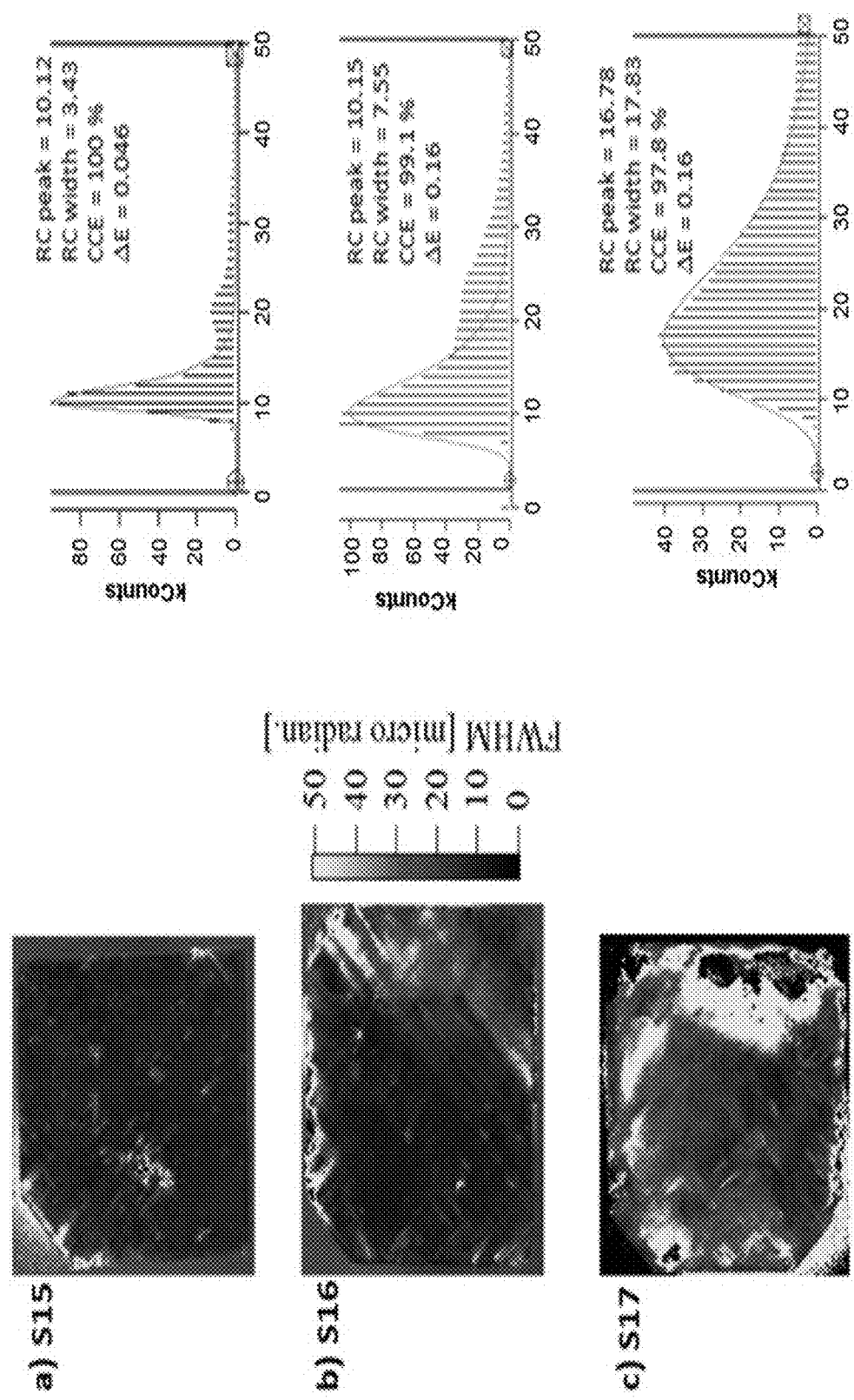
FIG. 12 shows the map of the rocking curve width of various samples of diamond based detectors and the corresponding histograms of RC width for quantification of average RC peak and RC width distribution according to a preferred embodiment of the invention.

FIG. 12 shows the map of x-ray rocking curve (RC) width of the three samples accompanied by their respective histograms. Sample 17 which has broader distribution of RC width and higher average RC width shows a drop in the CCE even though it has the lowest fluorescence intensity (impurities) among the three samples. The FHWM/MP widens as the RC width distribution is broadened. Energy resolution of less than 0.7% can be obtained for RC width distribution of less than 4.0 µRadian.

The ratio of full-width-at-half-maximum (FWHM) to the most probable peak (MP) from charge (negative Landau) signal distribution is FHWM/MP <3.0% when the electronic device grade single crystal diamond detector is exposed to a radiation source in the form of Americium ($^{241}$Am) radiation source is shown in FIG. 12.

This result implies that the energy resolution of the diamond based detector is mostly affected by the value of RC width distribution. The smaller the RC width distribution, the higher the CCE, as shown in FIG. 12.

Thus, the electronic device grade single diamond has a low lattice defect when the energy resolution of the diamond based detectors is low, which correspond to a small rocking curve (RC) width distribution which result in a high CCE. As shown in FIG. 12, sample S15 has a CCE of 100% when the RC width distribution is 3.43, which is lower than that of those of other samples.

Thus, the RC width distribution is a method used to further assess the electronic properties (i.e. CCE) of the electronic device grade single crystal diamond. However, such a method is restricted to only for diamond with already very low impurities. Hence, RC width as well as the ultralow fluorescence play a very important role in making a good detector base on diamond.

Figure 6:
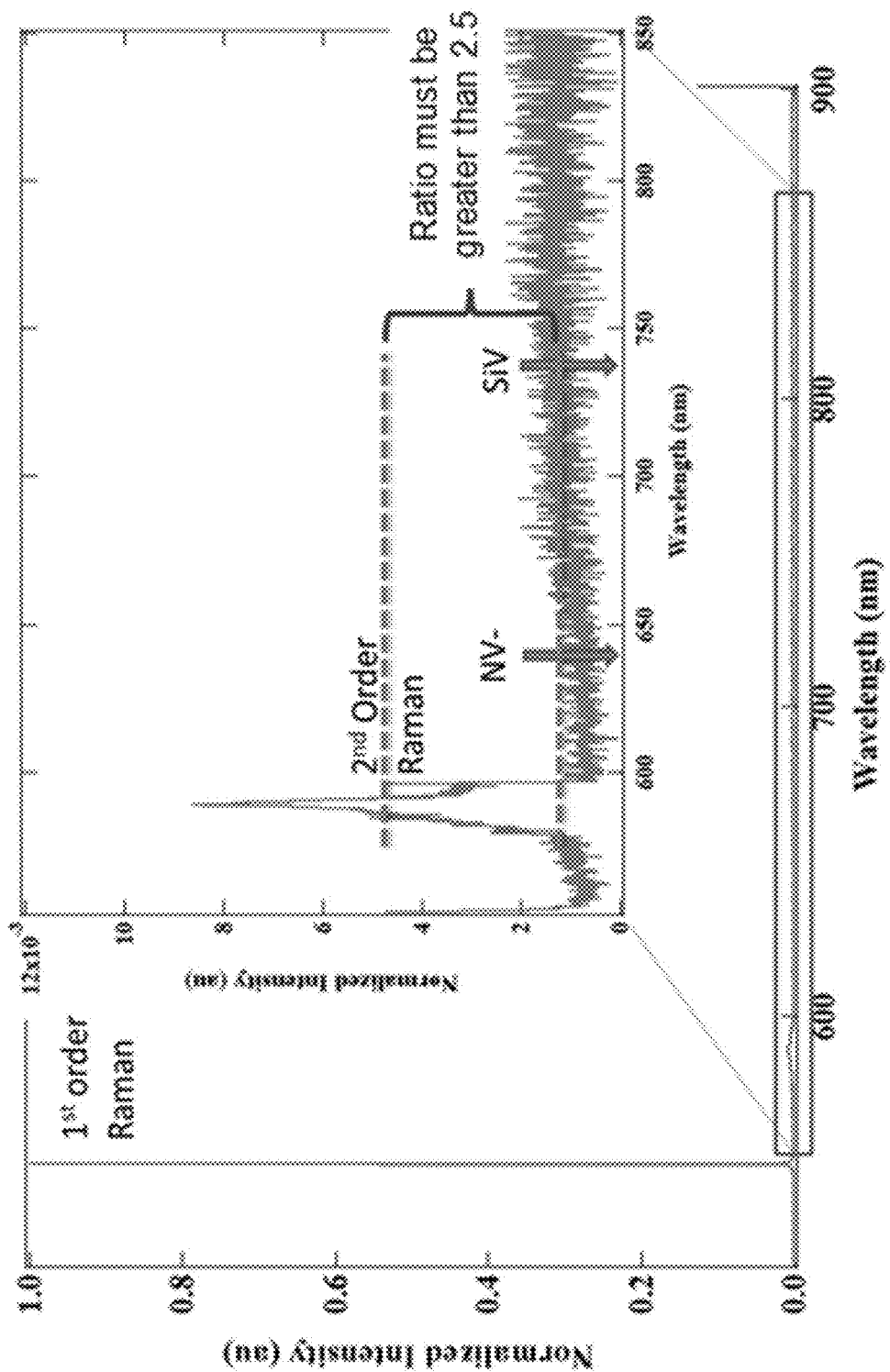
FIG. 6 shows the photoluminescence spectrum obtained from 514.5 nm laser excitation measured at room temperature (295K) according to a preferred embodiment of the invention. There is no visible peak from nitrogen and silicon related vacancies.

In a preferred embodiment of the present invention, the ratio of the $2^{nd}$ order Raman peak (~596 nm) to the photoluminescence line of negatively charged nitrogen vacancy (NV$^-$=637 nm) and silicon vacancy (SiV=738 nm) is greater than 2.5 as shown in the photoluminescence spectrum in FIG. 6. The photoluminescence spectrum is obtained from 514.5 nm Argon excitation source at room (295K) temperature. Low temperature (77K) photoluminescence at 488 nm laser excitations does not show any visible defects or fluorescence intensity (impurities) in the range of 490-900 nm. All peaks are normalised with respect to Raman first order line at 552 nm. Thus, low fluorescence intensity (impurities) is determined when low temperature (77K) photoluminescence at 488 nm laser excitations does not show any visible defects in the range of 490 nm to 900 nm, whereby the photoluminescence spectrum is obtained from 514.5 nm Argon excitation source at room (295K) temperature.

In accordance with an aspect of the present invention, the electronic device grade single diamond having a thickness up to 2500 µm is produced. In a preferred embodiment of the present invention, a diamond seed layer having a thickness of less than 2500 µm may be attached to a substrate.

Figure 7:
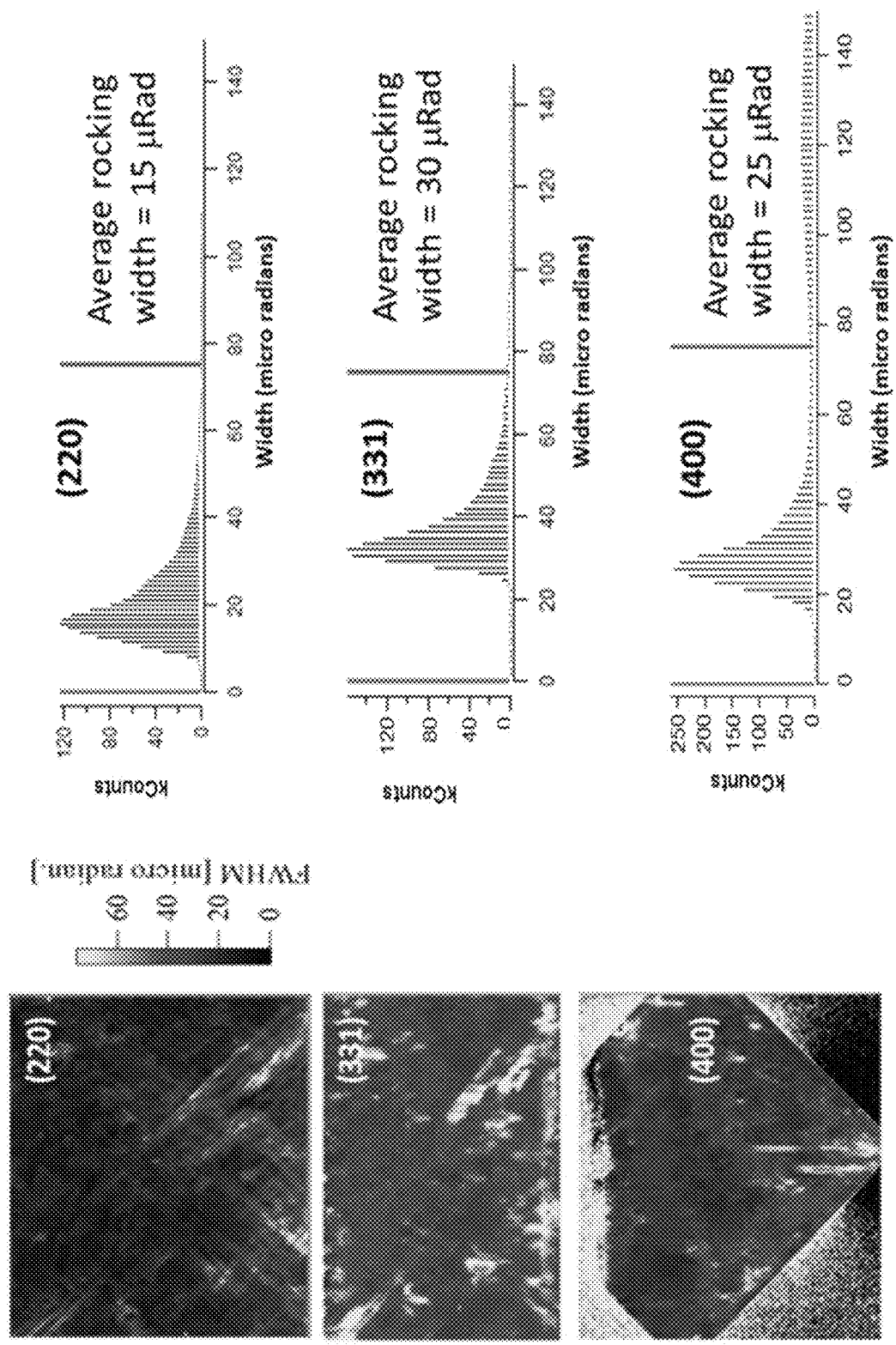
FIG. 7 shows the map of the rocking curve width throughout the entire sample at different crystallographic planes according to a preferred embodiment of the invention. The histogram shows a narrow distribution of the rocking width and at least 90% volume of electronic device grade single crystal diamond lies below 40 micro radians (μRad).

Beside impurities which affects the electronic device grade single crystal diamond's electronic properties, it is found that lattice defects and dislocations reduce the carrier lifetimes by trapping radiation generated charges at the defect sites. The electronic device grade single crystal diamond of the present invention has a very narrow average rocking curve width that does not exceed 40 micro radians in at least 90% volume of the electronic device grade single diamond as shown in the map of the rocking curve in FIG. 7 in the preferred embodiment of the present invention. The corresponding distribution of the rocking curve width is displayed as histogram. Generally, a smaller rocking curve width (darker regions) indicates good lattice structure and a larger rocking curve width (brighter region) indicates lattice imperfection. This is true for different crystallographic planes (220), (331), (400).

Figure 8:
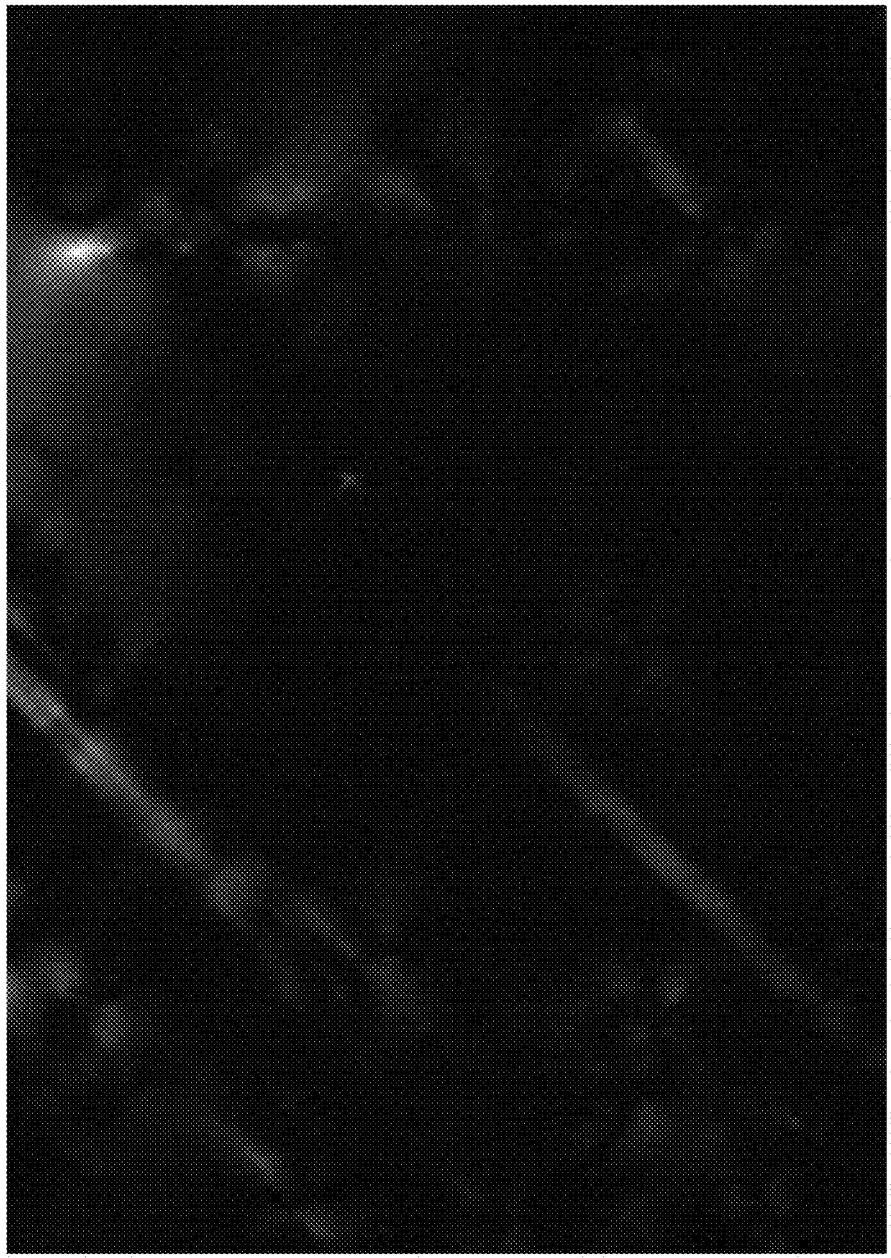
FIG. 8 shows the cross-polarized image taken from the electronic-device grade single crystal diamond produced by the method at 40× magnification according to a preferred embodiment of the invention. There are no visible traces of large dislocations. However, there are petal-shape defects and inclusions occurring as brighter contrast in the cross-polarized image.

Cross-polarized image showing nearly an absence of brighter areas indicates that the electronic device grade single crystal diamond has substantially low stress and low lattice imperfection as shown in FIG. 8. As shown, no inclusions and petal like structures are observed. Other characteristics include low fluorescent intensity (impurities).

It is submitted that the inclusion in the electronic device grade single crystal diamond affects the electronic characteristics in a detrimental manner. It is preferably that the aerial density of inclusions must be <$10^3$/m$^2$ so as not to affect the electronic characteristics of the electronic device grade single crystal diamond.

It is apparent to a person skilled in the art that many modifications, alternatives and variations may be made to the preferred embodiment of the present invention as described above without departing from the spirit and scope of the present invention. Accordingly, it is intended to embrace all such modifications, alternatives and variations that fall within the scope of the included claims.

What is claimed is:

1. A method utilising microwave plasma chemical vapour deposition (MPCVD) process of producing electronic device grade single crystal diamond comprising:
   (a) selecting a diamond seed or substrate having a predetermined orientation having non-diamond phases or other induced surface damages,
   (b) pre-growth conditioning the seed diamond or substrate by cleaning and etching of said non-diamond phases and other induced surface damages from the diamond seed or substrate, whereby this step is performed one or more times, and wherein this step comprises removing non-diamond phases from the substrate by cleaning it in a boiling acid bath having temperature greater than 300° C. and subsequently plasma etching for 30 to 180 minutes, at an etching temperature from 700° C. to 1200° C. in a MPCVD chamber having an atmosphere with a pressure of 13.3 to 40 kPa (100 to 300 torr), and wherein the atmosphere therein comprises of 0.1% to 10% oxygen per unit of hydrogen;
   (c) growing a layer of extremely low crystal defect density diamond surface on the cleaned/etched diamond seed or substrate one or more times wherein the growth process takes place at a temperature from about 700° C. to about 1200° C. in a MPCVD chamber, wherein the atmosphere comprises 1% to 15% CH$_4$ per unit of H$_2$ and from 1% to 50% 02 per unit of CH$_4$; and
   (d) thereafter growing electronics device grade single crystal diamond on top of the layer or layers of the low crystal defect density diamond surface at a temperature of about 700° C. to about 1200° C. in the MPCVD chamber, wherein the pressure comprises about 100 to about 300 torr and the atmosphere comprises a mixture of about 0.1% to about 15% CH$_4$ per unit of H$_2$ only, the growth rate of the electronic device grade single crystal diamond being 1 µm/hour to 15 µm/hour.

2. The method according to claim 1, wherein the diamond seed or substrate have an orientation of {100}.

3. The method accordingly to claim 1, wherein step (a) comprises of looking at the high magnification optical images of 100× to check for surface defects, polishing induced defects, etch pits and inclusions.

4. The method according to claim 1, wherein step (a) further comprises of subsequently performing cross-polarised imaging on the diamond seed to check for the presence of any lattice imperfection as a result of strain, and performing crystal-axis check of the substrate to ensure that off-axis angle relative to the {100} orientation axis does not exceed 3 degrees, and if necessary, etching the top surface to reveal and/or remove the surface damage to reduce the overall defect density.

5. The method according to claim 1, wherein the plasma etching method for diamond preparations take place in a MPCVD chamber considerably free of nitrogen, and the MPCVD chamber comprises gas precursors which are well purified such that the total impurities are less than 500 ppb.

6. The method of claim 1 wherein there is no traces of detectable nitrogen at 270 nm in the UV region spectrum.

\* \* \* \* \*